(12) United States Patent
Horiuchi et al.

(10) Patent No.: US 9,318,270 B2
(45) Date of Patent: Apr. 19, 2016

(54) PEROVSKITE SOLAR CELL

(71) Applicants: Tamotsu Horiuchi, Shizuoka (JP);
Tohru Yashiro, Kanagawa (JP); Yuuji Tanaka, Shizuoka (JP)

(72) Inventors: Tamotsu Horiuchi, Shizuoka (JP);
Tohru Yashiro, Kanagawa (JP); Yuuji Tanaka, Shizuoka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/667,987

(22) Filed: Mar. 25, 2015

(65) Prior Publication Data

US 2015/0279573 A1    Oct. 1, 2015

(30) Foreign Application Priority Data

Mar. 27, 2014    (JP) .................. 2014-065842

(51) Int. Cl.
*H01L 51/46*    (2006.01)
*H01G 9/20*    (2006.01)
*H01L 51/42*    (2006.01)

(52) U.S. Cl.
CPC .......... *H01G 9/2059* (2013.01); *H01L 51/4226* (2013.01); *H01L 2251/306* (2013.01)

(58) Field of Classification Search
CPC ..................... H01L 51/4226; H01L 2251/306; H01G 9/2059
USPC ........................................................ 136/263
See application file for complete search history.

(56) References Cited

U.S. PATENT DOCUMENTS

2015/0136232 A1*    5/2015    Snaith ................ H01L 51/4226
                                                  136/263

FOREIGN PATENT DOCUMENTS

| JP | 1-220380 | 9/1989 |
| JP | 11-144773 | 5/1999 |
| JP | 2000-106223 | 4/2000 |
| WO | WO2007/100095 A1 | 9/2007 |
| WO | 2013/171517 A1 | 11/2013 |

OTHER PUBLICATIONS

Nature, Brian O'Regan, et al, vol. 353, Oct. 24, 1991, 737-740.
J.Am.Chem.Soc., M.K. Nazeeruddin, et al, 115, 1993, 6382-6390.
Semicond.Sci.Technol., K Tennakone, et al, vol. 10, 1995, 1689-1693.

(Continued)

*Primary Examiner* — Jayne Mershon
(74) *Attorney, Agent, or Firm* — Cooper & Dunham LLP

(57) ABSTRACT

An perovskite solar cell including a substrate; a first electrode provided on the substrate; an electron transport layer, including an electron transporting compound, provided on the first electrode; a perovskite compound layer, including a perovskite compound, provided on the electron transport layer; a hole transport layer, including a hole transport compound, provided on the perovskite compound layer; and a second electrode provided on the hole transport layer. The perovskite compound can be expressed by the general formula $X_\alpha Y_\beta M_\gamma$, where X is a halogen atom, Y is an alkylamine compound, M includes a mixture of lead and antimony, and a ratio of $\alpha:\beta:\gamma$ is 3:1:1.

8 Claims, 1 Drawing Sheet

SUBSTRATE 1

FIRST ELECTRODE 2

COMPACT ELECTRON TRANSPORT LAYER 3

POROUS ELECTRON TRANSPORT LAYER 4

PEROVSKITE COMPOUND LAYER 5

HOLE TRANSPORT LAYER 6

SECOND ELECTRODE 7

(56) References Cited

OTHER PUBLICATIONS

Electrochemistry, Akinori Konno, et al, 70, 2002, 432-434.
Synthetic Metals, Jurgen Hagen, et al, 89, 1997, 215-220.
Nature, 1998, U. Bach, et al, vol. 395, 583-585.
Chem.Lett., Kei Murakochi, et al, 1997, 471-472.
J.Am.Chem.Soc., Akihiro Kojima, et al, 131, 2009, 6050-6051.
Science, 2012, Michael M.Lee, sciencexpress, 1228604, 1-5.
European search report dated Nov. 24, 2015 in corresponding European Patent Application No. 15160752.0.
Silvia Colella et al.: "MAPbI3-xClx Mixed Halide Perovskite for Hybrid Solar Cells: The Role of Chloride as Dopant on the Transport and Structural Properties", Chemistry of Materials, vol. 25, No. 22, 2013.
David Mitzi: "Organic-Inorganic Perovskites Containing Trivalent Metal Halide Layers: The Templating Influence of the Organic Cation Layer", Inorganic Chemistry, vol. 39, No. 26, 2000.

* cited by examiner

- SUBSTRATE 1
- FIRST ELECTRODE 2
- COMPACT ELECTRON TRANSPORT LAYER 3
- POROUS ELECTRON TRANSPORT LAYER 4
- PEROVSKITE COMPOUND LAYER 5
- HOLE TRANSPORT LAYER 6
- SECOND ELECTRODE 7

PEROVSKITE SOLAR CELL

CROSS-REFERENCE TO RELATED APPLICATION

This patent application is based on and claims priority pursuant to 35 U.S.C. §119 from Japanese Patent Application No. 2014-065842, filed on Mar. 27, 2014 in the Japan Patent Office, which is hereby incorporated by reference herein in its entirety.

BACKGROUND

1. Technical Field

Exemplary embodiments of the present disclosure generally relate to a perovskite solar cell.

2. Description of the Related Art

Recently, the importance of a solar cell is ever-increasing as an alternative energy to fossil fuel and a measure against global warming. However, the cost of present solar cells as typified by a silicon-based solar cell is high and is a factor impeding widespread use.

Thus, various inexpensive solar cells are in research and development, among which a practical realization of a dye sensitization type solar cell announced by Graetzel et al. of École Polytechnique Fédérale de Lausanne is highly anticipated (disclosed in JP Patent No. 2664194; Nature, 353(1991)737; and J. Am. Chem. Soc., 115(1993)6382). The dye sensitization type solar cell includes a porous metal oxide semiconductor electrode on a transparent conductive glass substrate, a dye adsorbed on the surface of the porous metal oxide semiconductor electrode, an electrolyte having a reduction-oxidation pair, and a counter electrode. Photoelectric conversion efficiency is significantly enhanced by making porous the metal oxide semiconductor electrode, such as titanium oxide, to enlarge its surface area, and by conducting monomolecular adsorption of ruthenium complex as the dye.

Further, in the dye sensitization type solar cell announced by Graetzel et al., printing methods may be applied as manufacturing methods of an element. Thus, there is no need for expensive manufacturing equipment and manufacturing cost may be lowered. However, the dye sensitization type solar cell includes a volatile solvent and iodine. Accordingly, problems of decline in electric power generation efficiency due to degradation of iodine redox, and volatilization or leakage of the electrolytic solution are seen.

Examples of solid dye sensitization type solar cells that make up for the above-described problems are also disclosed. The following are specific examples of such solid dye sensitization type solar cells.
1) a solid dye sensitization type solar cell employing an inorganic semiconductor (disclosed in Semicond. Sci. Technol., 10(1995)1689; and Electrochemistry, 70(2002) 432),
2) a solid dye sensitization type solar cell employing a low molecular weight organic hole transport material (disclosed in JP-H11-144773-A; Synthetic Metals, 89(1997) 215; and Nature, 398(1998)583), and
3) a solid dye sensitization type solar cell employing a conductive polymer (disclosed in JP-2000-106223-A; and Chem. Lett., (1997)471).

The solid dye sensitization type solar cell disclosed in Semicond. Sci. Technol., 10(1995) employs copper iodide as material for a p-type semiconductor layer. The solid dye sensitization type solar cell disclosed in Semicond. Sci. Technol., 10(1995) exhibits comparatively good photoelectric conversion efficiency immediately after manufacture though after a few hours photoelectric conversion efficiency is halved due to an increase of crystal grains of copper iodide. The solid dye sensitization type solar cell disclosed in Electrochemistry, 70(2002)432 adds imidazoliniumthiocyanate to inhibit the crystalization of copper iodide though is insufficient.

The solid dye sensitization type solar cell employing the low molecular weight organic hole transport material was announced by Hagen et al. in Synthetic Metals, 89(1997)215, and was modified by Graetzel et al. in Nature, 398(1998)583. The solid dye sensitization type solar cell disclosed in JP-H11-144773-A employs a triphenylamine compound and includes forming a charge transport layer by vacuum deposition of the triphenylamine compound. As a result, the triphenylamine compound does not reach porous holes inside of a porous semiconductor. Accordingly, only low photoelectric conversion efficiency is obtained. The solid dye sensitization type solar cell disclosed in Nature, 398(1998)583 dissolves a hole transport material of a spiro type in an organic solvent, and obtains a composite body of nano titania particles and the hole transport material with spin coating. The optimal value of a nano titania particle film thickness is approximately 2 µm. This is extremely thin compared to a film thickness of 10 µm to 20 µm in a case in which an iodine electrolytic solution is employed. Due to the thickness being approximately 2 µm, the amount of dye adsorbed on titanium oxide is small. Accordingly, sufficient light absorption or sufficient carrier generation is difficult. Thus, the properties of the solid dye sensitization type solar cell disclosed in Nature, 398(1998) 583 fall short of a solid dye sensitization type solar cell employing an electrolytic solution. A reason as to why the optimal value of the nano titania particle film thickness is approximately 2 µm is disclosed as being due to insufficient permeation of a hole transport material when the nano titania particle film thickness becomes too thick.

The solid dye sensitization type solar cell employing the conductive polymer was announced by Yanagida et al. of Osaka University in Chem. Lett., (1997)471 and employs polypyrrole. However, photoelectric conversion efficiency of the solid dye sensitization type solar cell employing the conductive polymer is also low. The solid dye sensitization type solar cell employing polythiophene derivative disclosed in JP-2000-106223-A employs an electrolytic polymerization method to form a charge transport layer on a porous titanium oxide electrode having adsorbed dye. However, there are problems of desorption of the dye from the titanium oxide or decomposition of the dye.

Recently, a perovskite solar cell in which a perovskite type compound absorbs light and generates electric power was announced by Miyasaka et al. of Toin University of Yokohama in J. Am. Chem. Soc., 131(2009)6050. The perovskite type compound employed in the perovskite solar cell is formed by mixing halogenated methylamine and lead halide.

The perovskite type compound exhibits strong absorption with respect to visible light. However, the perovskite type compound is unstable within a solution. Thus, when an iodine electrolytic solution is employed, solar cell properties are low. A perovskite solar cell in which photoelectric conversion efficiency was enhanced was announced in Science 338(2012)643. Enhancement was obtained by employing a low molecular weight organic hole transport material instead of the iodine electrolytic solution. However, even with the perovskite solar cell announced in Science 338(2012)643, it cannot be said to obtain photoelectric conversion efficiency that is sufficiently satisfactory. Thus, there is a demand for an even higher photoelectric conversion efficiency.

At present, with respect to the above-examined solar cells, there are no solar cells that perform satisfactorily.

SUMMARY

According to one aspect of the present invention, the perovskite solar cell includes a substrate 1; a first electrode 2 provided on the substrate 1; an electron transport layer (e.g., a compact electron transport layer 3 and a porous electron transport layer 4), having an electron transporting compound, provided on the first electrode 2; a perovskite compound layer 5, having a perovskite compound, provided on the electron transport layer; a hole transport layer 6, having a hole transport compound, provided on the perovskite compound layer 5; and a second electrode 7 provided on the hole transport layer 6. The perovskite compound can be expressed by the general formula $X_\alpha Y_\beta M_\gamma$, where X is a halogen atom, Y is an alkylamine compound, and M includes a mixture of lead and antimony. Ratio of $\alpha:\beta:\gamma$ is 3:1:1.

According to another aspect, in the perovskite solar cell, the perovskite compound is formed of halogenated alkylamine and a mixture of lead halide and halogenated antimony. For example, halogenated alkylamine includes at least one of halogenated methylamine and halogenated formamidine. Accordingly, the perovskite solar cell having good photoelectric conversion efficiency is obtained.

These and other aspects, features, and advantages will be more fully apparent from the following detailed description of illustrative embodiments, the accompanying drawings, and associated claims.

BRIEF DESCRIPTION OF THE DRAWINGS

The aforementioned and other aspects, features, and advantages of the present disclosure will be better understood by reference to the following detailed description when considered in connection with the accompanying drawings, wherein.

Figure 1:
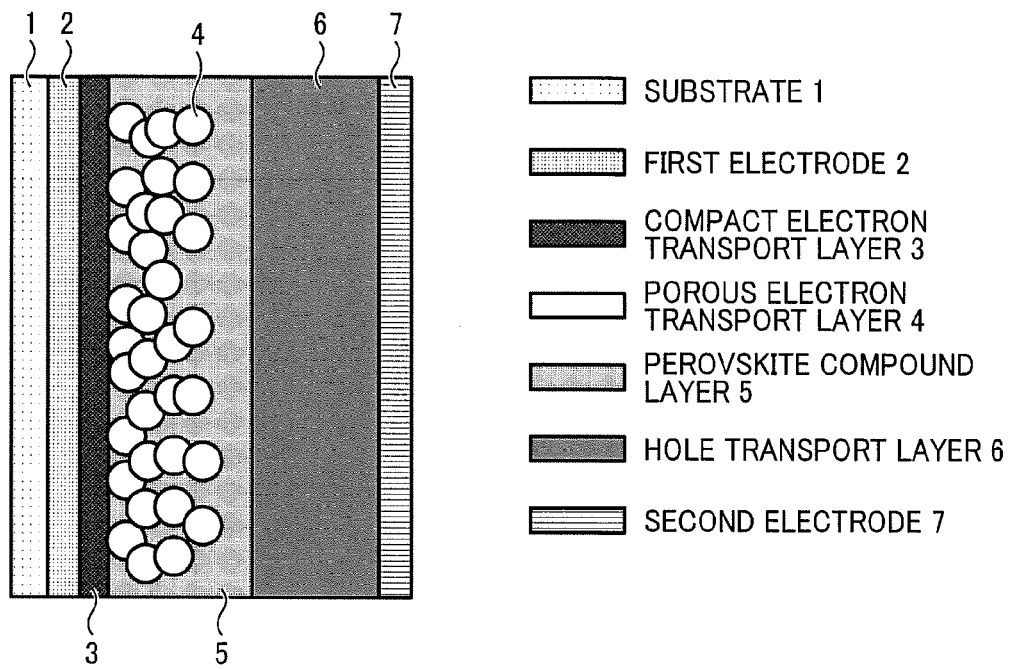
FIG. 1 is a cross-sectional view of an example of a configuration of a perovskite solar cell according to an embodiment of the present invention.

The accompanying drawings are intended to depict exemplary embodiments of the present disclosure and should not be interpreted to limit the scope thereof. The accompanying drawings are not to be considered as drawn to scale unless explicitly noted.

DETAILED DESCRIPTION

Hereinafter, exemplary embodiments of the present invention are described in detail with reference to the drawings. However, the present invention is not limited to the exemplary embodiments described below, but may be modified and improved within the scope of the present disclosure.

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in a similar manner, and achieve similar results.

In a later-described comparative example, illustrative embodiment, and alternative example, for the sake of simplicity, the same reference numerals will be given to constituent elements such as parts and materials having the same functions, and redundant descriptions thereof omitted.

The following is a detailed description of the perovskite solar cell according to an embodiment of the present invention.

FIG. 1 is a cross-sectional view of the configuration of the perovskite solar cell according to the embodiment of the present invention.

As shown in FIG. 1, in the perovskite solar cell, a first electrode 2 is provided on a substrate 1; a compact electron transport layer 3 is provided on the first electrode 2; a porous electron transport layer 4 is provided on the compact electron transport layer 3; a perovskite compound layer 5 is provided covering the electron transport layer (i.e., the compact electron transport layer 3 and the porous electron transport layer 4), a hole transport layer 6 is provided on the perovskite compound layer 5, and a second electrode 7 is provided on the hole transport layer 6.

<Substrate>

The substrate 1 employed in the perovskite solar cell according to the embodiment of the present invention requires a sufficient level of rigidity. Specific examples of materials for the substrate 1 include, but are not limited to, glass, transparent plastic plate, transparent plastic film, and inorganic transparent crystal.

<First Electrode (Electron Collecting Electrode)>

The first electrode 2 (hereinafter may be referred to as electron collecting electrode) employed in the perovskite solar cell according to the embodiment of the present invention has a through-hole and is provided on the substrate 1. Materials for the electron collecting electrode 2 include, for example, conductive substances that are transparent with respect to visible light or metals. Known materials employed in standard photoelectric conversion elements or liquid panels may be employed. Specific examples of materials for the electron collecting electrode 2 include, but are not limited to, indium tin oxide (hereinafter referred to as ITO), fluorine-doped tin oxide (hereinafter referred to as FTO), antimony-doped tin oxide (hereinafter referred to as ATO), indium zinc oxide, niobium titanium oxide, graphene, gold, silver, platinum (Pt), titanium (Ti), and chromium (Cr). The above-described materials may be used alone or a plurality of the above-described materials may be laminated. It is preferable that a thickness of the electron collecting electrode 2 is 5 nm to 100 μm, and more preferably 50 nm to 10 μm.

In addition, a metal lead wire may be employed.

Specific materials of the metal lead wire include, but are not limited to, aluminum, copper, silver, gold, platinum, and nickel. The metal lead wire may be set to the substrate 1 by deposition, sputtering, or pressure joining, and further provided with ITO and FTO thereon.

<Electron Transport Layer>

In the perovskite solar cell according to the embodiment of the present invention, the electron transport layer includes the electron transporting compound and is provided on the electron collecting electrode 2 serving as the first electrode 2.

It is preferable that the electron transporting compound is a metal oxide. Specific examples of the metal oxide include, but are not limited to, zinc oxide, tin oxide, titanium oxide, aluminum oxide, niobium oxide, yttrium oxide, and barium titanate. The above-described examples of the metal oxide may be used alone or used in a combination of two or more.

<<Compact Electron Transport Layer>>

In the perovskite solar cell according to the embodiment of the present invention, the electron transport layer formed of a semiconductor may be formed on the above-described electron collecting electrode 2. It is preferable that the electron transport layer has the laminated configuration in which the compact electron transport layer 3 is formed on the electron collecting electrode 2 and the porous electron transport layer 4 is formed on the compact electron transport layer 3. There are no limitations on film thickness of the compact electron transport layer 3 although it is preferable that the film thickness is 10 nm to 1 μm, and more preferably 20 nm to 700 nm. It is to be noted that the term "compact" in the compact electron transport layer 3 refers to a condition in which a packing density of an inorganic oxide semiconductor is higher than a packing density of fine particulate of the semiconductor in the electron transport layer.

<<Porous Electron Transport Layer>>

The porous electron transport layer 4 may be a single layer or a composite of multiple layers. In a case in which the porous electron transport layer 4 is a composite of multiple layers, the composite of multiple layers may be a multi-layer coat of a dispersion liquid of the fine particulates of the semiconductor with different particle diameters, a multi-layer coat of different types of semiconductors and different compositions of resin and additive. Multi-layer coating is effective in a case in which a film thickness is insufficient with one coating. Generally, as film thickness of the electron transport layer increases, an amount of the perovskite compound per unit projection area increases and capture rate of light increases, however, diffusion distance of injected electrons also increases and loss from charge recombination also increases. Therefore, a film thickness of the porous electron transport layer 4 is preferably 100 nm to 100 μm.

There are no limitations on the employed semiconductor and known semiconductors may be used.

Examples of the semiconductor include, but are not limited to, a single-element semiconductor such as silicon and germanium, a compound semiconductor such as a metal chalcogenide, and a compound having a perovskite structure.

Specific examples of the metal chalcogenide include, but are not limited to, an oxide of titanium, tin, zinc, iron, tungsten, zirconium, hafnium, strontium, indium, cerium, yttrium, lanthanum, vanadium, niobium, and tantalum; a sulfide of cadmium, zinc, lead, silver, antimony, and bismuth; a selenide of cadmium, and lead; and a telluride of cadmium.

Preferable examples of other compound semiconductors include, but are not limited to, a phosphide of zinc, gallium, indium, and cadmium; gallium arsenide; copper-indium-selenide; and copper-indium-sulfide. Preferable examples of the compound having the perovskite structure include, but are not limited to, strontium titanate, calcium titanate, sodium titanate, barium titanate, and potassium niobate.

Among the above-described examples of the semiconductor, oxide semiconductors are preferable. Particularly, titanium oxide, zinc oxide, tin oxide, and niobium oxide are preferable. The above-described preferable semiconductors may be used alone or in a combination of two or more. There are no limitations on crystal form of the above-described semiconductors and the crystal form may be a monocrystal, a polycrystal, or an amorphous.

There are no limitations on size of the fine particulate of the above-described semiconductors though it is preferable that an average particle diameter of a primary particle is 1 nm to 100 nm, and more preferably 5 nm to 50 nm. It is to be noted that by mixing or laminating the semiconductor with the fine particulate having an even larger average particle diameter, an effect of scattering of an incident light is obtained and efficiency may be enhanced. In this case, it is preferable that an average particle diameter of the fine particulate, of the semiconductor, having the even larger average particle diameter is 50 nm to 500 nm.

There are no limitations on manufacturing methods of the porous electron transport layer 4, which may be made using a method of forming a thin film in a vacuum such as sputtering, or by a wet-type film forming method. Considering manufacturing cost, the wet-type film forming method is preferable. Preferably, it is a method in which a paste is prepared, and the prepared paste is coated onto the electron collecting electrode 2. The prepared paste is a paste in which a sol or powder of the fine particulate of the semiconductor is dispersed. In a case of employing the wet-type film forming method, there are no limitations on coating methods and known methods may be employed. Various coating methods may be employed such as dip method, spray method, wire bar method, spin coating method, roller coating method, blade coating method, and gravure coating. Additionally, various wet-type printing methods may be employed such as relief printing, offset printing, gravure printing, intaglio printing, rubber plate printing, and screen printing.

In a case of manufacturing a dispersion liquid by mechanical pulverization or by employing a mill, at least the fine particulate of the semiconductor is dispersed alone in water or an organic solvent, or a mixture of the fine particulate of the semiconductor and a resin is dispersed in water or an organic solvent.

Specific examples of the resin include, but are not limited to, polymers or copolymers of vinyl compounds (e.g., styrene, vinyl acetate, acrylic ester, methacrylic ester), a silicone resin, a phenoxy resin, a polysulfone resin, a polyvinyl butyral resin, a polyvinyl formal resin, a polyester resin, a cellulose ester resin, a cellulose ether resin, an urethane resin, a phenol resin, an epoxy resin, a polycarbonate resin, a polyarylate resin, a polyamide resin, and a polyimide resin.

Specific examples of a solvent in which the fine particulate of the semiconductor are dispersed include, but are not limited to, water, alcohol-based solvents (e.g., methanol, ethanol, isopropyl alcohol, α-terpineol), ketone-based solvents (e.g., acetone, methyl ethyl ketone, methyl isobutyl ketone), ester-based solvents (e.g., ethyl formate, ethyl acetate, n-butyl acetate), ether-based solvents (e.g., diethyl ether, dimethoxyethane, tetrahydrofuran, dioxolane, dioxane), amide-based solvents (e.g.; N,N-dimethylformamide; N,N-dimethylacetamide; N-methyl-2-pyrrolidone), halogenated hydrocarbon-based solvents (e.g., dichloromethane, chloroform, bromoform, methyl iodide, dichloroethane, trichloroethane, trichloroethylene, chlorobenzene, o-dichlorobenzene, fluorobenzene, bromobenzene, iodobenzene, 1-chloronaphthalene), and hydrocarbon-based solvents (e.g., n-pentane; n-hexane; n-octane; 1,5-hexadiene; cyclohexane; methylcyclohexane; cyclohexadiene; benzene; toluene; o-xylene; m-xylene; p-xylene; ethylbenzene; cumene). The above-described solvents may be used alone or in a combination of two or more.

In the dispersion liquid of the fine particulate of the semiconductor or the paste of the fine particulate of the semiconductor obtained with a sol-gel method, the following may be added to prevent re-agglomeration of the fine particulate of the semiconductor. An acid (e.g., hydrochloric acid, nitric acid, acetic acid), a surface-active agent (e.g., polyoxyethylene (10) octyl phenyl ether), and a chelating agent (e.g., acetylacetone, 2-aminoethanol, ethylenediamine) may be added. In addition, a thickener may be added to enhance film formation. Specific examples of the thicknener include, but are not limited to, polymers such as polyethylene glycol and polyvinyl alcohol, and ethyl cellulose.

After coating the fine particulate of the semiconductor onto the electron collecting electrode 2, it is preferable that the fine particulate of the semiconductor is subjected to a process of firing, microwave irradiation, electron beam irradiation, or laser irradiation to electronically contact the particles of the semiconductor with each other, enhance film strength, and enhance adhesion of the fine particulate of the semiconductor to the electron collecting electrode 2. The above-described processes may be conducted alone or in a combination of two or more.

In a case of firing, there are no limitations on firing temperature range. However, if firing temperature is too high, the resistance of the substrate 1 may become high or the substrate 1 may melt. Thus, it is preferable that firing temperature range is 30° C. to 700° C., and more preferably 100° C. to 600° C. In addition, there are no limitations on firing time. Preferably, firing time is 10 minutes to 10 hours. To increase a surface area of the fine particulate of the semiconductor, or enhance an electron injection rate from a photosensitizing compound to the fine particulate of the semiconductor, the following plating processes may be conducted after firing. For example, a chemical plating that employs an aqueous solution of titanium tetrachloride or a mixed solution with an organic solvent may be conducted. Alternatively, an electrochemical plating that employs an aqueous solution of titanium trichloride may be conducted. The microwave irradiation may be irradiated from a side at which the electron transport layer is formed or from a backside of the formed electron transport layer. There are no limitations on irradiation time. Preferably, irradiation time is within 1 hour.

A film laminated by sintering the fine particulate of the semiconductor, having a diameter of a few dozen nm, is porous.

A nano-porous structure has an extremely large surface area and the extremely large surface area can be represented as a roughness factor. The roughness factor is a value representing actual internal area of a porous structure with respect to an area of the fine particulate of the semiconductor coated on the electron collecting electrode 2. Accordingly, a large roughness factor is preferable. However, in relation to a film thickness of the electron transport layer, the roughness factor is preferably 20 or more.

<Perovskite Compound Layer>

In the perovskite solar cell according to an embodiment of the present invention, the perovskite compound layer 5, having the perovskite compound, is provided on the electron transport layer.

The perovskite compound is a composite material of an organic compound and an inorganic compound. Preferably, the perovskite compound has a layered perovskite structure in which a layer formed of a halogenated metal and a layer having arrayed organic cation molecules are laminated in an alternating sequence. The perovskite compound is expressed as the following general formula.

   general formula

In the general formula, X is the halogen atom, Y is the alkylamine compound, and M includes the mixture of lead and antimony. The ratio of $\alpha:\beta:\gamma$ is 3:1:1.

Specific examples of the halogen atom include, but are not limited to, chlorine, bromine, and iodine. The above-described examples may be used alone or in a combination of two or more. Specific examples of the alkylamine compound include, but are not limited to, methylamine, ethylamine, n-butylamine, and formamidine. M represents the mixture of lead and antimony.

It is to be noted that M may include other components other than lead and antimony. However, a content of lead and antimony are preferably 90% by mass or more. A blending ratio (mass ratio) of lead and antimony is preferably 99.99:0.01 to 75:25, and more preferably 99:1 to 85:15. When the blending ratio of lead and antimony is within the above-described preferable range, a stable perovskite structure is formed.

The perovskite compound may be formed with a single step precipitation method or a two-step precipitation method. The single step precipitation method is a method of preparing a solution of the halogenated metal (e.g., the mixture of lead halide and halogenated antimony) and halogenated alkylamine dissolved or dispersed in a solvent, coating the prepared solution on the electron transport layer, and drying. The two-step precipitation method is a method of preparing a solution of the halogenated metal dissolved or dispersed in a solvent, coating the prepared solution on the electron transport layer, drying, and immersing in a solution in which halogenated alkylamine is dissolved in a solvent. Preferably, the two-step precipitation method is employed for forming the perovskite compound. Halogenated alkylamine preferably includes at least one of halogenated methylamine and halogenated formamidine.

Methods of coating the prepared solution on the electron transport layer include, but are not limited to, immersion method, spin coating method, spray method, dip method, roller method, and air knife method. In addition, conducting precipitation onto the electron transport layer in a supercritical fluid employing, for example, carbon dioxide is also possible.

In the case of the two-step precipitation method, methods to contact the solution of halogenated alkylamine to the halogenated metal formed on the electron transport layer include, but are not limited to, immersion method, spin coating method, spray method, dip method, roller method, and air knife method. In addition, contacting by precipitation of the solution of halogenated alkylamine in a supercritical fluid employing, for example, carbon dioxide is also possible.

After forming the perovskite compound on the electron transport layer, a sensitizing dye may be adsorbed. There are no limitations on a compound employed as the sensitizing dye as long as photo-excitation occurs to the compound with an employed excitation light.

Specific examples of the compound include, but are not limited to, metal complex compounds (disclosed in Japanese Unexamined Patent Application Publication (Translation of PCT Application) No. JP-H07-500630; JP-H10-233238-A; JP-2000-26487-A; JP-2000-323191-A; JP-2001-59062-A), coumarin compounds (disclosed in JP-H10-93118-A; JP-2002-164089-A; JP-2004-95450; J. Phys. Chem. C, 7224, Vol. 111(2007)), polyene compounds (disclosed in JP-2004-95450-A; Chem. Commun., 4887(2007)), indoline compounds (disclosed in JP-2003-264010-A; JP-2004-63274-A; JP-2004-115636-A; JP-2004-200068-A; JP-2004-235052-A; J. Am. Chem. Soc., 12218, Vol. 126(2004); Chem. Commun., 3036(2003); Angew. Chem. Int. Ed., 1923, Vol. 47(2008)), thiophene compounds (disclosed in J. Am. Chem. Soc., 16701, Vol. 128(2006); and J. Am. Chem. Soc., 14256, Vol. 128(2006)), cyanine dyes (disclosed in JP-H11-86916-A; JP-H11-214730-A; JP-2000-106224-A; JP-2001-76773-A; JP-2003-7359-A), merocyanine dyes (disclosed in JP-H11-214731-A; JP-H11-238905-A; JP-2001-52766-A; JP-2001-76775-A; JP-2003-7360-A), 9-arylxanthene compounds (disclosed in JP-H10-92477-A; JP-H11-273754-A; JP-H11-273755-A; JP-2003-31273-A;), triarylmethane compounds (disclosed in JP-H10-93118-A; JP-2003-31273-A), phthalocyanine compounds (disclosed in JP-H09-199744-A; JP-H10-233238-A; JP-H11-204821-A; JP-H11-265738-A; J. Phys. Chem., 2342, Vol. 91(1987); J. Phys. Chem. B, 6272, Vol. 97(1993); Electroanal. Chem., 31, Vol. 537(2002); JP-2006-032260-A; J. Porphyrins Phthalocyanines, 230, Vol. 3(1999); Angew. Chem. Int. Ed., 373, Vol. 46(2007); Langmuir, 5436, Vol. 24(2008)), and porphyrin compounds.

Among the above-described examples of the compound, preferably, metal complex compounds, indoline compounds, thiophene compounds, and porphyrin compounds are employed.

<Hole Transport Layer>

In the perovskite solar cell according to an embodiment of the present invention, the hole transport layer 6, having the hole transport compound, is provided on the perovskite compound layer 5.

A liquid electrolytic solution or a solid hole transport compound may be employed for the hole transport layer 6. Preferably, the solid hole transport compound is employed.

In a case of employing the liquid electrolytic solution, the liquid electrolytic solution preferably includes an electrolyte, a solvent, and an additive.

Specific examples of preferable electrolytes include, but are not limited to, a combination of iodine-metal iodides (e.g., lithium iodide, sodium iodide, potassium iodide, cesium iodide, calcium iodide), a combination of iodine-iodine salts of quaternary ammonium compounds (e.g., tetraalkylammonium iodide, pyridinium iodide, imidazolium iodide), a combination of bromine-metal bromides (e.g., lithium bromide, sodium bromide, potassium bromide, cesium bromide, calcium bromide), a combination of bromine-bromide salts of quaternary ammonium compounds (e.g., tetraalkylammonium bromide, pyridinium bromide), metal complexes (e.g., ferrocyanide acid salt-ferricyanide acid salt, ferrocene-ferricenium ion), sulfur compounds (e.g., sodium polysulfide, alkylthiol-alkyldisulfide), metal complexes (e.g., viologen dyes, hydroquinone-quinone, cobalt), and nitroxide radical compounds.

The above-described electrolytes may be used alone or in a combination of two or more. When an ion liquid such as imidazolium iodide is employed as the electrolyte, there is no need to employ a solvent.

Electrolyte concentration of the electrolytic solution is preferably 0.05 M to 20 M, and more preferably 0.1 M to 15 M.

Specific examples of preferable solvents employed for the electrolytic solution include, but are not limited to, carbonate-based solvents (e.g., ethylene carbonate, propylene carbonate), heterocyclic compounds (e.g., 3-methyl-2-oxazolidinone), ether-based solvents (e.g., dioxane, diethyl ether, ethylene glycol dialkyl ether), alcohol-based solvents (e.g., methanol, ethanol, polypropylene glycol monoalkyl ether), nitrile-based solvents (e.g., acetonitrile, benzonitrile), and non-protonic polar solvents (e.g., dimethyl sulfoxide, sulfolane). In addition, basic compounds (e.g., t-butylpyridine; 2-picoline; 2,6-lutidine) may be used together with the above-described preferable solvents.

The electrolyte may be made into a gel by methods of adding a polymer, adding an oil gelling agent, polymerization including a polyfunctional monomer, and a cross-linking reaction of a polymer.

In a case of gelation of the electrolyte by adding the polymer, preferable polymers are, for example, polyacrylonitrile and polyvinylidene fluoride.

In a case of gelation of the electrolyte by adding the oil gelling agent, preferable gelling agents are, for example, dibenzylidene-D-sorbitol; a cholesterol derivative; an amino acid derivative; an alkylamide derivative of trans-(1R,2R)-1, 2-cyclohexanediamine; an alkyl urea derivative; N-octyl-D-gluconamidebenzoate; a two-headed amino acid derivative; and a quaternary ammonium derivative.

In a case of polymerization with the polyfunctional monomer, preferable monomers are, for example, divinylbenzene, ethylene glycol dimethacrylate, ethylene glycol diacrylate, diethylene glycol dimethacrylate, triethylene glycol dimethacrylate, pentaerythritol triacrylate, and trimethylolpropane triacrylate.

Further, including a monofunctional monomer is also possible. Specific examples of the monofunctional monomer include, but are not limited to, an acrylic acid (e.g., acrylamide, methylacrylate), an ester or an amide derived from an α-alkyl acrylic acid, an ester derived from a fumaric acid (e.g., diethyl fumarate) or a maleic acid (e.g., dimethyl maleate, diethyl fumarate), a diene (e.g., butadiene, cyclopentadiene), an aromatic vinyl compound (e.g., styrene, p-chlorostyrene, sodium styrenesulfonate), a vinyl ester, acrylonitrile, methacrylonitrile, a vinyl compound including a nitrogen-containing heterocycle, a vinyl compound including a quaternary ammonium salt, N-vinylformamide, vinyl sulfonate, vinylidene fluoride, a vinyl alkyl ether, and N-phenylmaleimide. An amount of the polyfunctional monomer with respect to a total amount of monomers is preferably 0.5% by mass to 70% by mass, and more preferably 1.0% by mass to 50% by mass.

The above-described monomers may be polymerized with radical polymerization. The above-described monomers for the gel electrolyte may be polymerized with thermal radical polymerization, photo radical polymerization, electron ray radical polymerization, or electrochemical radical polymerization.

In a case of forming a cross-linked polymer by heating, an employed polymerization initiator is preferably an azo-based initiator (e.g., 2,2'-azobisisobutyronitrile; 2,2'-azobis(2,4-dimethyl valeronitrile); dimethyl-2,2'-azobis(2-methyl propionate), or a peroxide-based initiator (e.g., benzoyl peroxide).

An added amount of the polymerization initiator with respect to the total amount of monomers is preferably 0.01% by mass to 20% by mass, and more preferably 0.1% by mass to 10% by mass.

In a case of gelation of the electrolyte with the cross-linking reaction of the polymer, preferably a cross-linking agent and a polymer including a reactive group necessary for the cross-linking reaction are used together.

A preferable example of the reactive group is a nitrogen-containing heterocycle (e.g., pyridine, imidazole, thiazole, oxazole, triazole, morpholine, piperidine, and piperazine). A preferable example of the cross-linking agent is a reagent with two functions or more in which electrophilic reaction is possible with respect to a nitrogen atom of halogenated alkyl, halogenated aralkyl, sulfonic acid ester, acid anhydride, acid chloride, and isocyanate.

The solid hole transport compound may be an inorganic compound or an organic compound. Preferably, the organic compound is employed.

An inorganic hole transport layer employing an inorganic solid compound is formed within pores of the porous electron transport layer 4 by methods such as casting (e.g., casting of copper iodide, and copper thiocyanate), coating, spin coating, immersion, or electroplating.

In a case of employing an organic solid compound, a single layer configuration formed of a single material or a laminated layer configuration formed of multiple compounds may be employed. In a case of the laminated layer configuration, it is preferable that a polymer material is employed for an organic hole transport material layer adjacent to the second electrode 7. By employing a polymer material having good film forming capability, a surface of the porous electron transport layer 4 may be made smoother and photoelectric conversion property may be enhanced.

It is difficult for the polymer material to permeate the porous electron transport layer 4. Thus, the polymer material is good for coating the surface of the porous electron transport layer 4. The polymer material also exhibits an effect of preventing short circuit when forming the second electrode 7. As a result, the perovskite solar cell exhibits an even higher photoelectric conversion property.

An organic hole transport material employed alone in the single layer configuration is a known organic hole transport compound. Specific examples of the organic hole transport compound include, but are not limited to, an oxadiazole compound (disclosed in JP-S34-5466-A), a triphenylmethane compound (disclosed in JP-S45-555-A), a pyrazoline compound (disclosed in JP-S52-4188-A), a hydrazone compound (disclosed in JP-S55-42380-A), an oxadiazole compound (disclosed in JP-S56-123544-A), a tetraaryl benzidine compound (disclosed in JP-S54-58445-A), and a stilbene compound (disclosed in JP-S58-65440-A, JP-S60-98437-A).

In the case of the laminated layer configuration, the polymer material employed for an organic hole transport layer adjacent to the second electrode 7 is a known hole transport polymer material. Specific examples of the polymer material include, but are not limited to, polythiophene compounds (e.g., poly(3-n-hexylthiophene), poly(3-n-octyloxythiophene), poly(9,9'-dioctyl-fluorene-co-bithiophene), poly(3,3'''-didodecyl-quarter thiophene), poly(3,6-dioctylthieno[3,2-b]thiophene), poly(2,5-bis(3-decylthiophene-2-yl)thieno[3,2-b]thiophene, poly(3,4-didecylthiophene-co-thieno[3,2-b]thiophene), poly(3,6-dioctylthieno[3,2-b]thiophene-co-thieno[3,2-b]thiophene), poly(3,6-dioctylthieno[3,2-b]thiophene-co-thiophene), and poly(3,6-dioctylthieno[3,2-b]thiophene-co-bithiophene)); polyphenylene vinylene compounds (e.g., poly[2-methoxy-5-(2-ethylhexyloxy)-1,4-phenylenevinylene], poly[2-methoxy-5-(3,7-dimethyloctyloxy)-1,4-phenylenevinylene], and poly[2-methoxy-5-(2-ethylphexyloxy)-1,4-phenylenevinylene-co-(4,4'-phenylene-vinylene)]); polyfluorene compounds (e.g., poly(9,9'-didodecylfluorenyl-2,7-diyl), poly[(9,9-dioctyl-2,7-divinylenefluorene)-alt-co-(9,10-anthracene)], poly[(9,9-dioctyl-2,7-divinylenefluorene)-alt-co-(4,4'-biphenylene)], poly[(9,9-dioctyl-2,7-divinylenefluorene)-alt-co-(2-methoxy-5-(2-ethylhexyloxy)-1,4-phenylene)], and poly[(9,9-dioctyl-2,7-diyl)-co-(1,4-(2,5-dihexyloxyl)benzene)]); polyphenylene compounds (e.g., poly[2,5-dioctyloxy-1,4-phenylene], and poly[2,5-di(2-ethylhexyloxy-1,4-phenylene]; polyarylamine compounds (e.g., poly[(9,9-dioctylfluorenyl-2,7-diyl)-alt-co-(N,N'-diphenyl)-N,N'-di(p-hexylphenyl)-1,4-diaminobenzene], poly[(9,9-dioctylfluorenyl-2,7-diyl)-alt-co-(N,N'-bis(4-octyloxyphenyl)benzidine-N,N'-(1,4-diphenylene)], poly[(N,N'-bis(4-octyloxyphenyl)benzidine-N,N'-(1,4-diphenylene)], poly[(N,N'-bis(4-(2-ethylhexyloxy)phenyl)benzidine-N,N'-(1,4-diphenylene)], poly[phenylimino-1,4-phenylenevinylene-2,5-dioctyloxy-1,4-phenylenevinylene-1,4-phenylene], poly[p-tolylimino-1,4-phenylenevinylene-2,5-di(2-ethylhexyloxy)-1,4-phenylenevinylene-1,4-phenylene], and poly[4-(2-ethylhexyloxy)phenylimino-1,4-biphenylene]); and polythiadiazole compounds (e.g., poly[(9,9-dioctylfluorenyl-2,7-diyl)-alt-co-(1,4-benzo(2,1',3)thiadiazole], and poly[(3,4-didecylthiophene-co-(1,4-benzo(2,1',3)thiadiazole]). Among the above-described polymer materials, polythiophene compounds and polyarylamine compounds are particularly preferable when carrier mobility and ionization potential are taken into consideration.

In addition, various additives may be added to the above-described solid hole transport compound.

Specific examples of the additives include, but are not limited to, metal iodides (e.g., iodine, lithium iodide, sodium iodide, potassium iodide, cesium iodide, calcium iodide, copper iodide, iron iodide, silver iodide), quaternary ammonium salts (e.g., tetraalkylammonium iodide, pyridinium iodide), metal bromides (e.g., lithium bromide, sodium bromide, potassium bromide, cesium bromide, calcium bromide), bromide salts of quaternary ammonium compounds (e.g., tetraalkylammonium bromide, pyridinium bromide), metal chlorides (e.g., copper chloride, silver chloride), metal acetates (e.g., copper acetate, silver acetate, palladium acetate), metal sulfates (e.g., copper sulfate, zinc sulfate), metal complexes (e.g., ferrocyanide acid salt-ferricyanide acid salt, ferrocene-ferricenium ion), sulfur compounds (e.g., sodium polysulfide, alkylthiol-alkyldisulfide), ion liquids disclosed in Inorg. Chem. 35(1996)1168 (e.g., viologen dyes; hydroquinone; 1,2-dimethyl-3-n-propylimidazolinuim salt iodide; 1-methyl-3-n-hexylimidazolinuim salt iodide; 1,2-dimethyl-3-ethylimidazoliumtrifluoromethane sulfonic acid salt; 1-methyl-3-butylimidazoliumnonafluorobutyl sulfonic acid salt; 1-methyl-3-ethylimidazoliumbis(trifluoromethyl)sulfonylimide), basic compounds (e.g., pyridine, 4-t-butylpyridine, benzimidazol), and lithium compounds (e.g., lithium trifluoromethanesulfonylimide, lithium diisopropylimide).

In addition, an oxidizing agent may be added to make a portion of the organic solid compound into a radical cation in order to enhance conductivity.

Specific examples of the oxidizing agent include, but are not limited to, hexachloroantimonic acid tris(4-bromophenyl)aminium, silver hexafluoroantimonate, nitrosoniumtetrafluoroborate, and silver nitrate. It is to be noted that all of the organic hole transport material does not need to be oxidized by the added oxidizing agent. Only a portion of the organic hole transport material needs to be oxidized by the added oxidizing agent. Further, the added oxidizing agent may be taken out or left in the organic hole transport material after addition.

The inorganic and organic hole transport layer is formed directly onto the porous electron transport layer 4 supporting the perovskite compound. There are no limitations on manufacturing methods of the organic hole transport layer and may be a method of forming a thin film in a vacuum such as vacuum deposition, or may be a wet-type film forming method. Considering manufacturing cost, the wet-type film forming method is particularly preferable. A method of coating the organic hole transport layer onto the porous electron transport layer 4 supporting the perovskite compound is preferable.

In a case of employing the wet-type film forming method, there are no limitations on coating methods and known methods may be employed. Specific examples of coating methods include, but are not limited to, dip method, spray method, wire bar method, spin coating method, roller coating method, blade coating method, and gravure coating. Additionally, various printing methods may be employed such as relief printing, offset printing, gravure printing, intaglio printing, rubber plate printing, and screen printing. In addition, film formation may be conducted in a supercritical fluid or a subcritical fluid.

There are no limitations on the supercritical fluid as long as the supercritical fluid exists as a non-agglomerating high density fluid at temperatures and pressures beyond a critical point in which a fluid may coexist as a gas or a liquid, and the non-agglomerating high density fluid is at a state of a critical temperature or more, a critical pressure or more, and does not agglomerate when compressed. The supercritical fluid may be selected according to objective though it is preferable that the supercritical fluid has a low critical temperature.

It is preferable that the supercritical fluid is, for example, carbon monoxide, carbon dioxide, ammonia, nitrogen, water, alcohol-based solvents (e.g., methanol, ethanol, n-butanol), hydrocarbon-based solvents (e.g., ethane, propane, 2,3-dimethylbutane, benzene, toluene), halogen-based solvents (e.g., methylene chloride, chlorotrifluoromethane), and ether-based solvents (e.g., dimethyl ether).

Among the above-described examples of the supercritical fluid, carbon dioxide is particularly preferable. Carbon dioxide has a critical pressure of 7.3 MPa and a critical temperature of 31° C. that makes creation of a supercritical state easy. In addition, carbon dioxide is incombustible and easy to handle. The above-described examples of the supercritical fluid may be used alone or in a combination of two or more.

There are no limitations on the subcritical fluid as long as the subcritical fluid exists as a high pressure fluid at temperatures and pressures around a critical point. The subcritical fluid may be selected according to objective.

The above-described compounds of the above-described examples of the supercritical fluid may also be favorably employed as the subcritical fluid.

There are no limitations on the critical temperature and the critical pressure of the supercritical fluid. The critical temperature and the critical pressure may be selected according to objective. The critical temperature is preferably −273° C. or more to 300° C. or less, and more preferably 0° C. or more to 200° C. or less.

An organic solvent or an entrainer may be added and used together with the above-described supercritical fluid and subcritical fluid. By adding the organic solvent and the entrainer, solubility in the supercritical fluid can be easily adjusted.

Specific examples of the organic solvent include, but are not limited to, ketone-based solvents (e.g., acetone, methyl ethyl ketone, methyl isobutyl ketone), ester-based solvents (e.g., ethyl formate, ethyl acetate, n-butyl acetate), ether-based solvents (e.g., diisopropyl ether, dimethoxyethane, tetrahydrofuran, dioxolane, dioxane), amide-based solvents (e.g., N,N-dimethylformamide; N,N-dimethylacetamide; N-methyl-2-pyrrolidone), halogenated hydrocarbon-based solvents (e.g., dichloromethane, chloroform, bromoform, methyl iodide, dichloroethane, trichloroethane, trichloroethylene, chlorobenzene, o-dichlorobenzene, fluorobenzene, bromobenzene, iodobenzene, 1-chloronaphthalene), and hydrocarbon-based solvents (e.g., n-pentane; n-hexane; n-octane; 1,5-hexadiene; cyclohexane; methylcyclohexane; cyclohexadiene; benzene; toluene; o-xylene; m-xylene; p-xylene; ethylbenzene; cumene).

After providing the inorganic and organic compound onto the porous electron transport layer 4 supporting the perovskite compound, a press treatment may be conducted. It is conceivable that by conducting the press treatment, photoelectric conversion property may be enhanced due to increased adherence of the inorganic and organic compound to the electron transport layer including the porous electron transport layer 4.

There are no limitations on the press treatment method, which may be a press forming method employing a flat plate as represented by an immediate-release (IR) tablet shaper, or a roll press method employing a roller. It is preferable that a pressure of the press treatment is 10 kgf/cm$^2$ or more, and more preferably 30 kgf/cm$^2$ or more. There are no limitations on press time of the press treatment. Preferably, press time is 1 hour or less. In addition, heat may be applied when conducting press treatment.

When conducting press treatment, a release material may be sandwiched between a press machine and the electron collecting electrode 2. Specific examples of the release material include, but are not limited to, fluororesins such as polytetrafluoroethylene, polychlorotrifluoroethylene, a tetrafluoroethylene-hexafluoropropylene copolymer, a perfluoroalkoxyfluoro resin, polyvinylidene fluoride, an ethylene-tetrafluoroethylene copolymer, an ethylene-chlorotrifluoroethylene copolymer, and polyvinyl fluoride.

After conducting the above-described press treatment, before providing the second electrode 7, a metal oxide may be provided between the organic hole transport compound and the second electrode 7. Specific examples of a metal oxide include, but are not limited to, molybdenum oxide, tungsten oxide, vanadium oxide, and nickel oxide. Among the examples, molybdenum oxide is particularly preferable.

There are no limitations on methods of providing the metal oxide on the organic hole transport compound, which may be a method of forming a thin film in a vacuum such as sputtering or vacuum deposition, or may be a wet-type film forming method.

Preferably, the wet-type film forming method is one in which a paste having a sol or powder of the metal oxide is prepared, and then, the prepared paste is coated onto the hole transport layer 6.

In a case of employing the wet-type film forming method, there are no limitations on coating methods and known methods may be employed. Specific examples of coating methods include, but are not limited to, dip method, spray method, wire bar method, spin coating method, roller coating method, blade coating method, and gravure coating. Additionally, various printing methods may be employed such as relief printing, offset printing, gravure printing, intaglio printing, rubber plate printing, and screen printing.

A film thickness of the metal oxide is preferably 0.1 nm to 50 nm, and more preferably 1 nm to 10 nm.

<Second Electrode (Hole Collecting Electrode)>

In the perovskite solar cell according to an embodiment of the present invention, the second electrode 7 is formed on the hole transport layer 6. In addition, a substrate (not shown in drawings) opposite to the second electrode 7 may be formed on the second electrode 7. Specific examples of materials for the second electrode 7 include, but are not limited to, metals (e.g., platinum, gold, silver, copper, aluminum, rhodium, indium), carbon-based compounds (e.g., graphite, fullerene, carbon nanotube), conductive metal oxides (e.g., indium tin oxide (hereinafter referred to as ITO), fluorine-doped tin oxide (hereinafter referred to as FTO), antimony-doped tin oxide (hereinafter referred to as ATO)), and conductive polymers (e.g., polythiophene, polyaniline).

There are no limitations on a film thickness of the second electrode 7. The above-described materials for the second electrode 7 may be used alone, in a combination mixing two or more, or in a combination of laminating two or more.

EXAMPLES

Example 1

Manufacture of a Titanium Oxide Semiconductor Electrode

A solution of a mixture 2 mL of titanium tetra-n-propoxide, 4 mL of acetic acid, 1 mL of ion exchanged water, and 40 mL of 2-propanol is spin coated onto a FTO glass substrate and dried at room temperature. After drying, the coated FTO glass substrate is fired at 450° C. in air for 30 minutes. Accordingly, an electrode is obtained. Employing the above-described solution, spin coating is conducted until a film thickness of 50 nm is obtained on the electrode and is fired at 450° C. in air for 30 minutes. Accordingly, a compact electron transport layer is formed.

A titanium oxide paste 18NR-T (from Dyesol Ltd.) is spin coated on the above-described compact electron transport layer until a film thickness of 300 nm is obtained. Then, it is subjected to warm-air drying for 3 minutes at 120° C. After warm-air drying, the coated compact electron transport layer is fired at 500° C. in air for 30 minutes. Accordingly, a porous electron transport layer is formed.

<Manufacture of a Perovskite Compound Layer>

0.438 g of lead (II) iodide and 0.025 g of antimony (III) iodide are dissolved in a solution of 1.0 ml of N,N-dimethylformamide. The N,N-dimethylformamide solution including lead (II) iodide and antimony (III) iodide is spin coated on the above-described porous electron transport layer of titanium oxide and dried for 10 minutes at 100° C. Methylamine iodide is dissolved in an isopropyl alcohol solution having a concentration of 0.038M. The isopropyl alcohol solution including methylamine iodide is spin coated on the above-described coated porous electron transport layer of titanium oxide and dried. Then, the isopropyl alcohol solution, having a concentration of 0.038M, including methylamine iodide is spin coated and dried, again. Finally, isopropyl alcohol is spin coated on the repeatedly coated porous electron transport layer of titanium oxide and dried. Accordingly, a perovskite compound layer is formed. An obtained perovskite compound is a mixture of $CH_3NH_3PbI_3$ and $CH_3NH_3SbI_3$.

<Manufacture of a Hole Transport Layer>

50 mM of 2,2(7,7(-tetrakis-(n,N-di-p-methoxyphenylamine)9,9(-spirobifluorene))), 30 mM of lithiumbis(trifluoromethane sulfonyl)imide, and 200 mM of 4-t-butylpyridine are dissolved in a chlorobenzene solution. The chlorobenzene solution including 2,2(7,7(-tetrakis-(n,N-di-p-methoxyphenylamine)9,9(-spirobifluorene))), lithiumbis(trifluoromethane sulfonyl)imide, and 4-t-butylpyridine is spin coated on the above-described perovskite compound layer forming a film and air dried. Then, approximately 100 nm of gold is provided on, by vacuum deposition, the above-described coated perovskite compound layer that is air dried. Accordingly, a solar cell element of example 1 is obtained.

<Evaluation of Solar Cell Properties>

The obtained solar cell element of example 1 was placed under simulated sunlight irradiation (AM 1.5, 100 mW/cm$^2$) and photoelectric conversion efficiency is measured. The simulated sunlight irradiation was produced by solar simulator SS-80XIL (from EKO Instruments). The employed evaluation device was a solar cell evaluation system As-510-PV03 (from NF Corporation).

Figure 2:
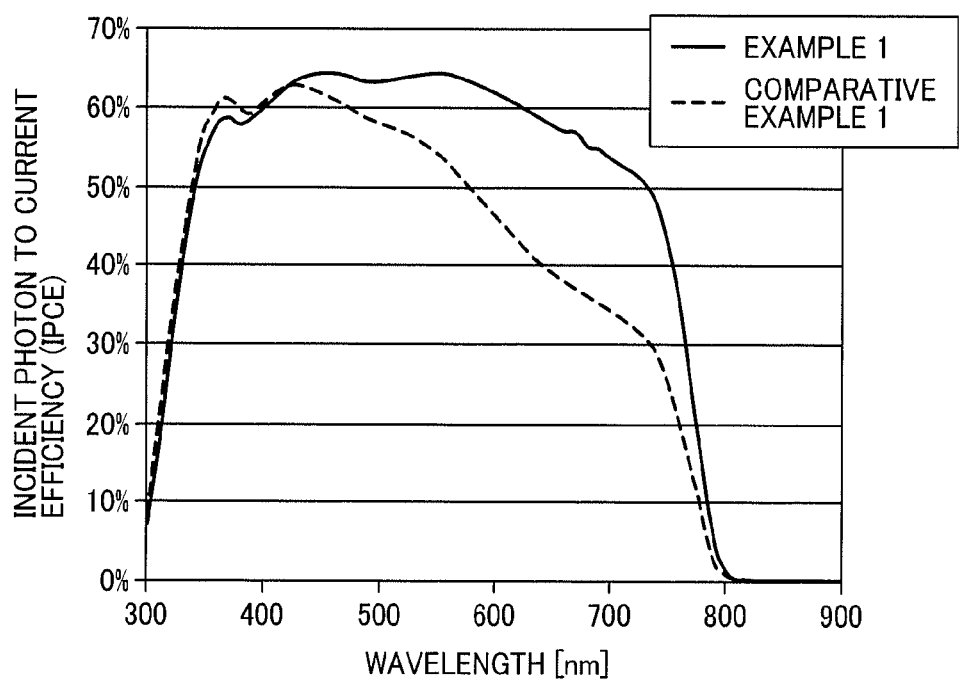
FIG. 2 is a graph showing incident photon to current efficiency (IPCE) of the perovskite solar cell of example 1 and comparative example 1.

The results showed good properties. More specifically, the results show an open circuit voltage of 0.91V, a short circuit current density of 14.80 mA/cm$^2$, form factor of 0.61, and a conversion efficiency of 8.22%. Results of measurement of an incident proton to current efficiency (hereinafter referred to as IPCE) of the obtained solar cell element of example 1 are shown in FIG. 2.

Comparative Example 1

A solar cell element of comparative example 1 was obtained with the above-described procedure of example 1 except for replacing the solution of 1.0 ml of N,N-dimethylformamide including dissolved 0.438 g of lead (II) iodide and 0.025 g of antimony (III) iodide with a solution of 1.0 ml of N,N-dimethylformamide including dissolved 0.461 g of lead (II) iodide. The above-described evaluation of example 1 was repeated for the solar cell element of comparative example 1.

The results show lower properties compared to the perovskite solar cell according to an embodiment of the present invention. More specifically, the results show an open circuit voltage of 0.90V, a short circuit current density of 12.4 mA/cm$^2$, form factor of 0.60, and a conversion efficiency of 6.7%. Results of measurement of an IPCE of the obtained solar cell element of comparative example 1 are also shown in FIG. 2. It can be understood from FIG. 2 that a value of IPCE, 500 nm to 800 nm, of the solar cell element of example 1 employing the perovskite compound formed with the mixture of lead (II) iodide and antimony (III) iodide increases (i.e., has better IPCE) compared to the solar cell element of comparative example 1 employing the perovskite compound formed with lead (II) iodide.

Example 2

A solar cell element of example 2 was obtained with the above-described procedure of example 1 except for replacing the solution of 1.0 ml of N,N-dimethylformamide including dissolved 0.438 g of lead (II) iodide and 0.025 g of antimony (III) iodide with a solution of 1.0 ml of N,N-dimethylformamide including dissolved 0.415 g of lead (II) iodide and 0.050 g of antimony (III) iodide. The above-described evaluation of example 1 was repeated for the solar cell element of example 2.

The results show good properties. More specifically, the results show an open circuit voltage of 0.90V, a short circuit current density of 15.9 mA/cm$^2$, form factor of 0.62, and a conversion efficiency of 8.87%.

Example 3

A solar cell element of example 3 was obtained with the above-described procedure of example 1 except for replacing the solution of 1.0 ml of N,N-dimethylformamide including dissolved 0.438 g of lead (II) iodide and 0.025 g of antimony (III) iodide with a solution of 1.0 ml of N,N-dimethylformamide including dissolved 0.392 g of lead (II) iodide and 0.075 g of antimony (III) iodide. The above-described evaluation of example 1 was repeated for the solar cell element of example 3.

The results show good properties. More specifically, the results show an open circuit voltage of 0.88V, a short circuit current density of 14.9 mA/cm$^2$, form factor of 0.66, and a conversion efficiency of 7.84%.

Example 4

A solar cell element of example 4 was obtained with the above-described procedure of example 1 except for replacing the chlorobenzene solution including dissolved 50 mM of 2,2(7,7(-tetrakis-(n,N-di-p-methoxyphenylamine)9,9(-spirobifluorene))), 30 mM of lithiumbis(trifluoromethane sulfonyl)imide, and 200 mM of 4-t-butylpyridine with a chlorobenzene solution including dissolved 50 mM of 2,2(7,7(-tetrakis-(n,N-di-p-methoxyphenylamine)9,9(-spirobifluorene))), 30 mM of lithiumbis(trifluoromethane sulfonyl)imide, 200 mM of 4-t-butylpyridine, and 6 mM of tris(2-(1H-pyrazole-1-yl)-4-tert-butylpyridine)cobalt(III)bis (trifluoromethane sulfonyl)imide. The above-described evaluation of example 1 was repeated for the solar cell element of example 4.

The results show good properties. More specifically, the results show an open circuit voltage of 0.90V, a short circuit current density of 14.6 mA/cm$^2$, form factor of 0.61, and a conversion efficiency of 8.65%.

Example 5

A solar cell element of example 5 was obtained with the above-described procedure of example 1 except for replacing the isopropyl alcohol solution, having a concentration of 0.038M, including methylamine iodide with an isopropyl alcohol solution, having a concentration of 0.038M, including dissolved methylamine chloride. The above-described evaluation of example 1 was repeated for the solar cell element of example 5.

The results show good properties. More specifically, the results show an open circuit voltage of 0.94V, a short circuit current density of 14.0 mA/cm$^2$, form factor of 0.60, and a conversion efficiency of 7.90%. It is to be noted that an obtained perovskite compound is a mixture of $CH_3NH_3PbClI_2$ and $CH_3NH_3SbClI_2$.

Example 6

A solar cell element of example 6 was obtained with the above-described procedure of example 1 except for replacing the titanium oxide paste 18NR-T (from Dyesol Ltd.) with zinc oxide. The above-described evaluation of example 1 was repeated for the solar cell element of example 6.

The results show good properties. More specifically, the results show an open circuit voltage of 0.90V, a short circuit current density of 14.2 mA/cm$^2$, form factor of 0.61, and a conversion efficiency of 7.80%.

Example 7

A solar cell element of example 7 was obtained with the above-described procedure of example 1 except for replacing the titanium oxide paste 18NR-T (from Dyesol Ltd.) with alumina. The above-described evaluation of example 1 was repeated for the solar cell element of example 7.

The results show good properties. More specifically, the results show an open circuit voltage of 0.93V, a short circuit current density of 14.6 mA/cm$^2$, form factor of 0.58, and a conversion efficiency of 7.88%.

Comparative Example 2

A solar cell element of comparative example 2 was obtained with the above-described procedure of example 1 except for replacing the solution of 1.0 ml of N,N-dimethylformamide including dissolved 0.438 g of lead (II) iodide and 0.025 g of antimony (III) iodide with a solution of 1.0 ml of N,N-dimethylformamide including dissolved 0.438 g of lead (II) iodide and 0.015 g of manganese (II) iodide. The above-described evaluation of example 1 was repeated for the solar cell element of comparative example 2.

The results show lower properties compared to the perovskite solar cell according to an embodiment of the present invention. More specifically, the results show an open circuit voltage of 0.61V, a short circuit current density of 6.38 mA/cm$^2$, form factor of 0.62, and a conversion efficiency of 2.38%.

Comparative Example 3

A solar cell element of comparative example 3 was obtained with the above-described procedure of example 1 except for replacing the solution of 1.0 ml of N,N-dimethylformamide including dissolved 0.438 g of lead (II) iodide and 0.025 g of antimony (III) iodide with a solution of 1.0 ml of N,N-dimethylformamide including dissolved 0.438 g of lead (II) iodide and 0.025 g of bismuth (III) iodide. The above-described evaluation of example 1 was repeated for the solar cell element of comparative example 3.

The results show lower properties compared to the perovskite solar cell according to an embodiment of the present invention. More specifically, the results show an open circuit voltage of 0.53V, a short circuit current density of 0.76 mA/cm$^2$, form factor of 0.38, and a conversion efficiency of 0.15%.

Comparative Example 4

A solar cell element of comparative example 4 was obtained with the above-described procedure of example 1 except for replacing the solution of 1.0 ml of N,N-dimethylformamide including dissolved 0.438 g of lead (II) iodide and 0.025 g of antimony (III) iodide with a solution of 1.0 ml of N,N-dimethylformamide including dissolved 0.438 g of lead (II) iodide and 0.025 g of titanium (IV) iodide. The above-described evaluation of example 1 was repeated for the solar cell element of comparative example 4.

The results show lower properties compared to the perovskite solar cell according to an embodiment of the present invention. More specifically, the results show an open circuit voltage of 0.78V, a short circuit current density of 12.2 mA/cm$^2$, form factor of 0.62, and a conversion efficiency of 5.9%.

Comparative Example 5

A solar cell element of comparative example 5 was obtained with the above-described procedure of example 1 except for replacing the solution of 1.0 ml of N,N-dimethylformamide including dissolved 0.438 g of lead (II) iodide and 0.025 g of antimony (III) iodide with a solution of 1.0 ml of N,N-dimethylformamide including dissolved 0.438 g of lead (II) iodide and 0.016 g of barium (II) iodide. The above-described evaluation of example 1 was repeated for the solar cell element of comparative example 5.

The results show lower properties compared to the perovskite solar cell according to an embodiment of the present invention. More specifically, the results show an open circuit voltage of 0.79V, a short circuit current density of 12.3 mA/cm$^2$, form factor of 0.61, and a conversion efficiency of 5.93%.

Comparative Example 6

A solar cell element of comparative example 6 was obtained with the above-described procedure of example 1 except for replacing the solution of 1.0 ml of N,N-dimethylformamide including dissolved 0.438 g of lead (II) iodide and 0.025 g of antimony (III) iodide with a solution of 1.0 ml of N,N-dimethylformamide including dissolved 0.438 g of lead (II) iodide and 0.016 g of zinc (II) iodide. The above-described evaluation of example 1 was repeated for the solar cell element of comparative example 6.

The results show lower properties compared to the perovskite solar cell according to an embodiment of the present invention. More specifically, the results show an open circuit voltage of 0.82V, a short circuit current density of 11.9 mA/cm$^2$, form factor of 0.60, and a conversion efficiency of 5.85%.

Comparative Example 7

A solar cell element of comparative example 7 was obtained with the above-described procedure of example 1 except for replacing the solution of 1.0 ml of N,N-dimethylformamide including dissolved 0.438 g of lead (II) iodide and 0.025 g of antimony (III) iodide with a solution of 1.0 ml of N,N-dimethylformamide including dissolved 0.438 g of lead (II) iodide and 0.025 g of indium (III) iodide.

The results show lower properties compared to the perovskite solar cell according to an embodiment of the present invention. More specifically, the results show an open circuit voltage of 0.88V, a short circuit current density of 12.6 mA/cm$^2$, form factor of 0.60, and a conversion efficiency of 6.65%.

From the above-described results of examples 1 to 3, it can be understood that the perovskite solar cell according to an embodiment of the present invention obtains good properties by employing the perovskite compound obtained from the mixture of lead iodide and antimony iodide. From the above-described results of example 4, it can be understood that a high photoelectric conversion efficiency is obtained by adding a cobalt complex to the hole transport layer. From the above-described results of example 5, it can be understood that a solar cell having good properties can also be obtained by changing halogen of alkylamine from iodine to chlorine. From the above-described results of examples 6 and 7, a solar cell having good properties can also be obtained by employing not only titanium oxide but other oxides for the electron transporting compound.

As described above, exemplary embodiments of the present invention are described in detail with reference to the drawings. However, the present invention is not limited to the exemplary embodiments described above, but may be modified and improved within the scope of the present disclosure.

What is claimed is:

1. An perovskite solar cell, comprising:
a substrate;
a first electrode provided on the substrate;
an electron transport layer, including an electron transporting compound, provided on the first electrode;
a perovskite compound layer, including a perovskite compound, provided on the electron transport layer;
a hole transport layer, including a hole transport compound, provided on the perovskite compound layer; and
a second electrode provided on the hole transport layer,
wherein the perovskite compound is expressed as a general formula $X_\alpha Y_\beta M_\gamma$, where X is a halogen atom, Y is an alkylamine compound, M includes a mixture of lead and antimony, and a ratio of $\alpha:\beta:\gamma$ is 3:1:1.

2. The perovskite solar cell of claim 1, wherein the perovskite compound is formed of halogenated alkylamine and a mixture of lead halide and halogenated antimony.

3. The perovskite solar cell of claim 2, wherein halogenated alkylamine includes at least one of halogenated methylamine and halogenated formamidine.

4. The perovskite solar cell of claim 1, wherein the electron transporting compound is a metal oxide.

5. The perovskite solar cell of claim 4, wherein the metal oxide is selected from the group consisting of zinc oxide, tin oxide, titanium oxide, aluminum oxide, niobium oxide, yttrium oxide, and barium titanate.

6. The perovskite solar cell of claim 1, wherein the electron transport layer is a laminated layer of a compact electron transport layer and a porous electron transport layer.

7. The perovskite solar cell of claim 1, wherein the hole transport layer includes at least lithium trifluoromethanesulfonylimide.

8. The perovskite solar cell of claim 1, wherein the hole transport layer includes at least a pyridine compound.

* * * * *